(12) United States Patent
Drewniok et al.

(10) Patent No.: US 6,494,522 B1
(45) Date of Patent: Dec. 17, 2002

(54) DOOR MODULE WITH ELECTRICAL WIRES AND CONNECTORS

(75) Inventors: Daniel Drewniok, Frankfurt (DE); Andreas Schroeder, Mommensheim (DE)

(73) Assignee: Meritor Automotive GmbH, Frankfurt (DE)

( * ) Notice: Subject to any disclaimer, the term of this patent is extended or adjusted under 35 U.S.C. 154(b) by 0 days.

(21) Appl. No.: 09/611,117

(22) Filed: Jul. 6, 2000

(30) Foreign Application Priority Data

Jul. 7, 1999 (DE) .......................... 199 31 189

(51) Int. Cl.[7] .............................. B60J 5/04; H01R 33/00
(52) U.S. Cl. ...................... 296/146.7; 296/208; 439/34
(58) Field of Search ............................. 296/146.7, 208; 439/34

(56) References Cited

U.S. PATENT DOCUMENTS

| | | | | |
|---|---|---|---|---|
| 6,036,501 A | * | 3/2000 | Wojewnik et al. ............ | 439/34 |
| 6,106,303 A | * | 8/2000 | Wojewnik ..................... | 439/34 |
| 6,126,228 A | * | 10/2000 | Davis, Jr. et al. ......... | 296/146.7 |
| 6,127,021 A | * | 10/2000 | Kelman ..................... | 296/146.7 |
| 6,142,556 A | * | 11/2000 | Tanaka et al. ............ | 296/146.7 |
| 6,149,853 A | * | 11/2000 | Luckett et al. ........... | 296/146.7 |
| 2002/0041110 A1 | * | 4/2002 | Odashima et al. ....... | 296/146.7 |

* cited by examiner

*Primary Examiner*—D. Glenn Dayoan
*Assistant Examiner*—H. Gutman
(74) *Attorney, Agent, or Firm*—Carlson, Gaskey & Olds

(57) ABSTRACT

A method of producing components, such as a door modules with electrical wires and connectors, is provided. The door module includes a substrate material with conductor tracks arranged therein. Electrical wires, which preferably have connectors at the ends, are placed into the conductor tracks. The substrate is then placed in a mold and filled with foamed plastic to encase the wires and form the door module. The connectors protrude from the door module to permit electrical components to be attached to the connectors.

6 Claims, 2 Drawing Sheets

DOOR MODULE WITH ELECTRICAL WIRES AND CONNECTORS

BACKGROUND OF THE INVENTION

This invention relates to a door module for a vehicle, and more specifically, the invention relates to a method of forming a door module about electrical wires and connectors.

In motor vehicle construction as well as in numerous other fields of application, components with corresponding cable harnesses must be arranged on a mounting plate, and fastened there by a wide variety of methods, before they are finally fitted. Typically, the harnesses are secured by only a few attachment points. The mounting plate often consists of metal and offers only few possibilities of integrating the required components. In vehicle construction, problems arise in this respect particularly with the door modules, in which inadequate fastening of the cable harnesses leads to rattling and the fitting of the various components requires considerable installation times.

It is desireable that the harness be supported along its entire length as opposed to being attached only by a few points to the mounting plate. Therefore, what are needed are electrical conductor tracks that are reliably laid and which allows additional components or molded parts to be easily integrated. Furthermore, the laid conductor tracks are to be optionally protected from physical effects, such as vibration or moisture.

SUMMARY OF THE INVENTION AND ADVANTAGES

The present invention provides a component such as a door module which includes electrical wires and connectors. The door module includes a substrate material with conductor tracks arranged therein. Electrical wires, which preferably have connectors at the ends, are placed into the conductor tracks. The substrate is then placed in a mold and filled with foamed plastic to encase the wires and form the door module. The connectors protrude from the door module to permit electrical components to be attached to the connectors.

Accordingly, the above invention provides electrical conductor tracks that are reliably laid and which allows additional components or molded parts to be easily integrated. Furthermore, the laid conductor are to be optionally protected from physical effects, such as vibration or moisture.

BRIEF DESCRIPTION OF THE DRAWINGS

Other advantages of the present invention can be understood by reference to the following detailed description when considered in connection with the accompanying drawings wherein.

DETAILED DESCRIPTION OF THE PREFERRED EMBODIMENT

Figure 1:
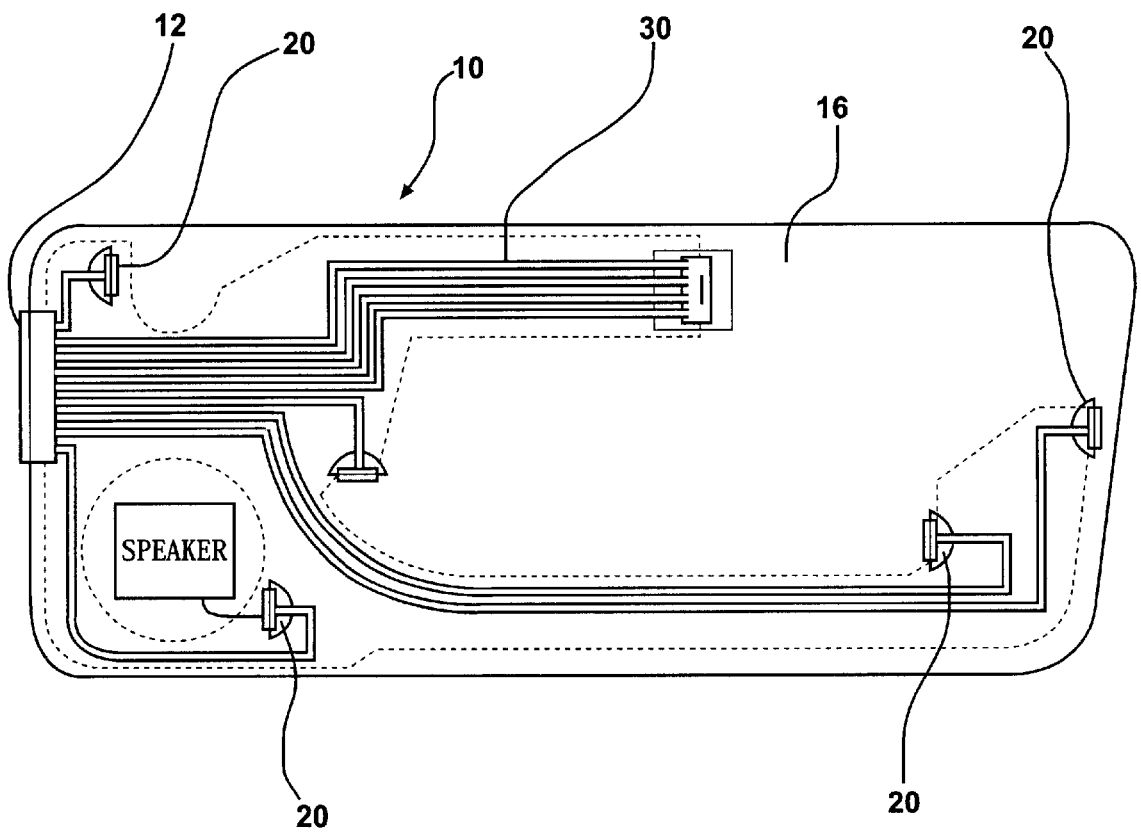
FIG. 1 is a front elevational view of a door module of the present invention for the side doors of a vehicle.
Figure 2:
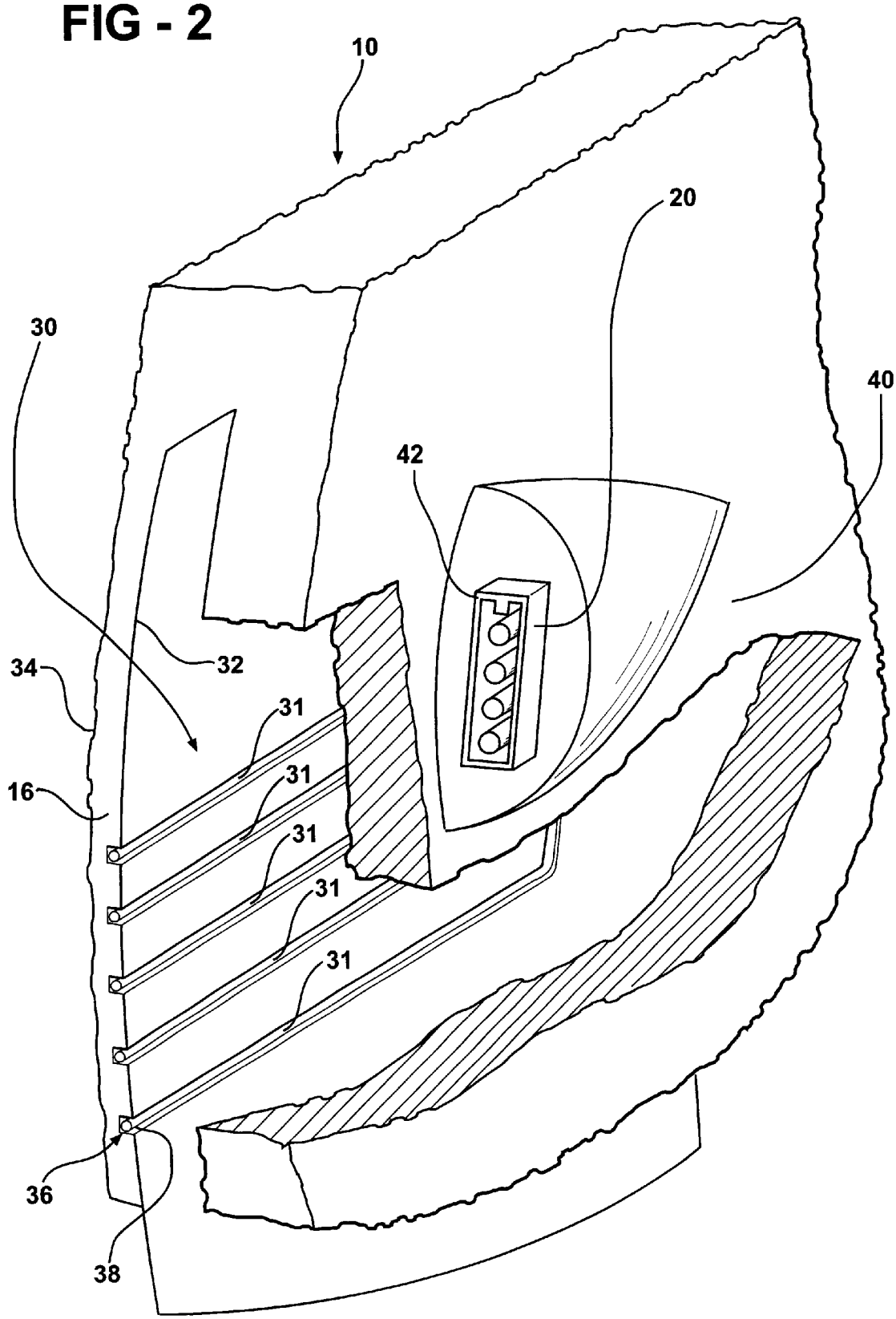
FIG. 2 is a perspective cross-sectional view of the door module with a plug-in connector.

A door module 10 is shown in FIGS. 1 and 2. It is to be understood that the invention may be used for vehicle components other that doors. Referring to FIG. 1, the door module 10 is adapted to be fitted into the side doors of a passenger vehicle. The door module 10 has an input plug-in connection 12 for supplying the module with electrical power required for the electrical components (not shown), such as window lifters, door lighting, or speakers. From this plug-in connection 12, the conductor tracks or electrical wires 30 extend on the mounting plate to the individual end plug-in connections 20, which permit the connection of end loads, such as window lifters, door lighting, or speakers.

The substrate material 16, which has the conductor tracks 30 and the plug-in connectors 12, 20 connected to them, preferably is constructed from plastic. The substrate 16 is placed into a mold, and the mold is filled with foamed plastic. Additional molded parts, components, and/or electrical components connected to the conductor tracks 30 may be arranged on the substrate material 16 before foam filling. The finished component then contains all the required constituent components, which may be connected to other components of the overall device via the externally accessible plug-in connectors 20.

The conductor tracks 30 may be individual cables or standard wires 31, round or flat ribbon conductors, or cable harness. The substrate includes first 32 and second 34 spaced apart surfaces. The conductor tracks 30 are preferably supported by the substrate material 16 against movement before introducing the foam by using thermoformed plastic film having channels 36 or depressions 38 in file first surface 32 for receiving the conductor tracks 30. Alternatively, the conductor tracks 30 may also be stamped or pressed into the plastic form. The substrate material 16 with the conductor tracks 30 and the other components or molded parts is placed into the outer mold of the mold defining component and the mold is then filled with a suitable foamed plastic material. Either thermoplastic and thermosetting resins, preferably reinforced with glass fibers, may be used.

FIG. 2 shows the end plug-in connection 20 in more detail. The substrate material with the conductor tracks 30 attached on it is preferably surrounded on both sides by foamed plastic 40. The outer surface of the foamed plastic 40 defines a component boundary. In the embodiment shown, the mounting plate represents the rear side of the door module 10. The end plug-in connector 20 has an end portion 42 protruding from the component boundary and is intended for connection with the wire leads from an electrical component. The connector 20, in the embodiment shown, is hollow and permits the introduction of the attachment plug (not shown) parallel to the front of the surface of the component. However, it is to be understood that the end plug-in connector 20 may be of any suitable configuration. For example, a depression may be formed in front of the plug-in connector or, alternatively, the connector 20 may terminate in a flat connection.

The end portion 42 of the plug-in connectors 12 or 20 are protected against the penetration of foam before foam filling by suitable coverings, which can easily be removed after foam filling. Depending on the design of these connectors, a wide variety of solutions for this are available to a person skilled in the art.

The present invention method and the components produced with it represent a very economical solution, because it is possible for the component to be largely prefabricated with all the components required. Consequently, installation work is reduced significantly and at the same time a considerable weight savings may be achieved in comparison with designs previously customary in vehicle construction.

The invention has been described in an illustrative manner, and it is to be understood that the terminology that has been used is intended to be in the nature of words of description rather than of limitation. Obviously, many modifications and variations of the present invention are possible in light of the above teachings. It is, therefore, to be understood that within the scope of the appended claims the invention may be practiced otherwise than as specifically described.

What is claimed is:

1. An interior trim component comprising:
   a substrate having first and second spaced apart surfaces for providing structural support;
   a channel in said substrate forming a depression in said first surface and spaced from said second surface;
   conductor tracks supported on the substrate, said conductor tracks terminating in a connector;
   a foam cover defining a component boundary, said foam cover formed over said conductor tracks with a portion of said connector protruding from and surrounded by said foam cover.

2. The component according to claim 1, wherein said substrate comprises a thermoformed film defining said channel.

3. The component according to claim 2, wherein said conductor tracks include individual wires.

4. The component according to claim 2, wherein said conductor tracks include a wiring harness having a plurality of individual wires.

5. The component according to claim 2, wherein said conductor tracks include a ribbon having individual wires.

6. The component according to claim 1, wherein said conductor tracks are stamped into said substrate.

* * * * *